United States Patent
Alvarez et al.

[11] Patent Number: 6,020,409
[45] Date of Patent: Feb. 1, 2000

[54] ROUTES TO DIELECTRIC GEL FOR PROTECTION OF ELECTRONIC MODULES

[75] Inventors: Khristopher Edward Alvarez; Roger Allen Frazer, both of Midland; Myron Timothy Maxson, Sanford; Ann Walstrom Norris; Michael Raymond Strong, both of Midland; Beth Ann Witucki, Bay City; Shizhong Zhang, Midland, all of Mich.

[73] Assignee: Dow Corning Corporation, Midland, Mich.

[21] Appl. No.: 08/934,180

[22] Filed: Sep. 19, 1997

[51] Int. Cl.[7] ........................................ C08K 5/54
[52] U.S. Cl. ................. 524/267; 524/730; 524/731; 428/447
[58] Field of Search ..................... 524/267, 730, 524/731; 428/447, 901

[56] References Cited

U.S. PATENT DOCUMENTS

| | | | |
|---|---|---|---|
| 3,020,260 | 2/1962 | Nelson | 260/46.5 |
| 3,419,593 | 12/1968 | Willing . | |
| 3,445,420 | 5/1969 | Kookoosedes et al. . | |
| 3,989,667 | 11/1976 | Lee et al. . | |
| 4,100,627 | 7/1978 | Brill, III . | |
| 4,340,709 | 7/1982 | Jeram et al. . | |
| 4,766,176 | 8/1988 | Lee et al. . | |
| 4,824,390 | 4/1989 | Crane et al. . | |
| 4,987,169 | 1/1991 | Kuwata et al. | 524/267 |
| 4,990,560 | 2/1991 | Ikeno et al. | 524/267 |
| 5,017,654 | 5/1991 | Togashi et al. . | |
| 5,145,933 | 9/1992 | Grisoni et al. . | |
| 5,264,499 | 11/1993 | Hayashi et al. | 524/267 |
| 5,275,841 | 1/1994 | Wong . | |
| 5,371,163 | 12/1994 | Wilson . | |
| 5,571,583 | 11/1996 | Ikeno et al. | 524/268 |
| 5,571,853 | 11/1996 | Ikeno et al. | 524/268 |
| 5,668,225 | 9/1997 | Okazaki et al. | 525/478 |
| 5,679,734 | 10/1997 | Peccoux et al. | 524/267 |

FOREIGN PATENT DOCUMENTS

| | | | |
|---|---|---|---|
| 0 651 021 A2 | 5/1995 | European Pat. Off. | C08L 83/04 |
| 0 727 462 A2 | 8/1996 | European Pat. Off. | C08L 83/04 |
| 0 737 721 A1 | 10/1996 | European Pat. Off. | C08L 83/07 |
| 0 826 733 A2 | 3/1998 | European Pat. Off. | C08L 83/04 |
| 63-035654 | 7/1986 | Japan . | |
| WO 96/10608 | 4/1996 | WIPO | C08L 83/04 |

OTHER PUBLICATIONS

Kirk–Othmer, Encyclopedia of Chemical Technology, vol. 9, pp. 379–381, 1994.

*Primary Examiner*—Melvyn I. Marquis
*Attorney, Agent, or Firm*—Richard I. Gearhart; Larry A. Milco; Sharon K. Severance

[57] ABSTRACT

Polyorganosiloxane gels are prepared using compositions curable by a platinum catalyzed hydrosilation reaction that are characterized by the presence of a non-functional silicone fluid. The gel may contain additional components and may also be formulated into a multi-part system.

22 Claims, No Drawings

ROUTES TO DIELECTRIC GEL FOR PROTECTION OF ELECTRONIC MODULES

BACKGROUND OF THE INVENTION

1. Field of the Invention

This invention relates to curable organosiloxane compositions. More particularly, this invention relates to organosiloxane gels having a non-reactive silicone fluid therein, wherein the improved gel has less weight loss and improved heat stability, with no appreciable bleed.

2. Background Information

In many instances gels used as coating, potting, and encapsulating materials must maintain adhesion to electronic and electrical components and printed circuit boards in addition to the electrical connectors and conductors that pass through the coating or encapsulating material. Organosiloxane gels electronic applications are typically prepared from compositions containing high molecular weight polyorganosiloxanes. These materials that form the gels are expensive, and many applications would benifit from a gel that has the desired properties but at a reduced cost. In addition, it would be desirable to reduce the amount of the gel that evaporates and to improve the stability of the gel when in is exposed to high temperatures.

The inventors have discovered that large amounts of a non-functional silicone fluid can be added to a silicone gel without the fluid "bleeding out". The non-functional silicone fluid reduces the cost of the gel. The inventors have surprisingly found that adding a non-functional silicone fluid reduces the weight loss of the gel over time, and improves the heat aging properties of the gel as well. The gels may be used as an encapsulant or pottant to protect electronic circuit boards, or a material useful for dampening vibrations.

U.S. Pat. No. 5,145,933, which issued to Grisoni et al. on Sep. 8, 1992 describes organosiloxane gel forming compositions that cure by a platinum-catalyzed hydrosilation reaction. The curable compositions contain a polyorganosiloxane with vinyl radicals located only on non-terminal silicon atoms and two different types of organohydrogensiloxanes. One is a polydiorganosiloxane (1) containing silicon-bonded hydrogen atoms only at the terminal silicon atoms, and the second polyorganosiloxane (2) contains an average of at least three silicon-bonded hydrogen atoms per molecule, at least a portion of which are located on non-terminal silicon atoms. The percentage of the total silicon bonded hydrogen contributed by polyorganosiloxane (1) is equal to 81.36 minus a factor equal to 3.6 times the molar ratio of all silicon bonded hydrogen atoms in the curable composition, irrespective of source, to all of the alkenyl radicals present in the composition.

U.S. Pat. No. 4,340,709, issued on Jul. 20, 1982 to Jeram et al. relates to organosiloxane compositions that cure by a platinum-catalyzed hydrosilation reaction and contain the two types of organohydrogensiloxanes described in the Grisoni et al. patent. The molar ratio of the vinyl radicals present in the curable polyorganosiloxane to the silicon bonded hydrogen atoms present in the organohydrogensiloxane (1), referred to by Jeram et al. as a hydride coupler, is from 0.75 to 1.5. While Jeram et al teach that the viscosity of the vinyl-terminated curable polyorganosiloxane can be from 100 to 200,000 centipoise (0.1 to 200 Pa.s) the lowest viscosity disclosed in the exemplified compositions (examples 2 and 3) is a mixture of 61.8 parts of a dimethylvinylsiloxy-terminated polydimethylsiloxane with a viscosity of 4,000 cps (4 Pa.s) and 5 parts of a dimethylvinylsiloxy-terminated polydimethylsiloxane with a viscosity of 0.5 Pa.s. In these compositions the hydride coupler contributes 70 and 74 percent, respectively, of the silicon-bonded hydrogen atoms present in the curable compositions, and the compositions contain a reinforcing silica filler. The curable compositions of example 2 and 3 had mixed viscosities of 40 and 85 Pa.s, respectively.

One objective of this invention is to provide curable organosiloxane compositions which contain a silicone fluid that does not "bleed" from the cured composition. The gel may be used as a pottant or encapsulant, or as a material capable of dampening vibrations.

SUMMARY OF THE INVENTION

In accordance with the present invention, gels are prepared using compositions curable by a platinum catalyzed hydrosililation reaction that are characterized by the presence of a non-functional silicone fluid. This invention provides a curable organosiloxane composition comprising A. a first polyorganosiloxane having terminal siloxane units of the formula $R^1R^2_2SiO_{1/2}$ and non-terminal organosiloxane units of the formula $R^2_2SiO$ where $R^1$ represents an alkenyl radical or a hydrogen atom, and each $R^2$ is independently selected from $R^1$ and unsubstituted and substituted monovalent hydrocarbon radicals free of ethylenic unsaturation;

B. a polyorganosiloxane cross-linking agent containing an average of at least two silicon-bonded hydrogen atoms or alkenyl radicals per molecule, where the remaining silicon-bonded organic groups are monovalent hydrocarbon radicals selected from the same group as $R^2$ with the proviso that when the $R^1$ groups of ingredient A are alkenyl radicals, the cross-linking agent has at least two silicon bonded hydrogen atoms, and when the $R^1$ groups of ingredient A are silicon bonded hydrogen radicals, the cross-linking agent has at least two alkenyl radicals;

C. an amount of a hydrosilation catalyst sufficient to promote curing of said composition; and D. a non- functional silicone fluid which is at least 25% by weight of the composition.

The gel may contain additional components and may also be formulated into a multi-part system.

DETAILED DESCRIPTION OF THE INVENTION

The Polyorganosiloxane (Ingedient A)

The polyorganosiloxane referred to as ingredient A is a principal ingredient and comprises a first polyorganosiloxane having terminal siloxane units of the formula $R^1R^2_2SiO_{1/2}$ and non-terminal organosiloxane units of the formula $R^2_2SiO$ where $R^1$ represents an alkenyl radical or a hydrogen atom, and each $R^2$ is independently and individually selected from $R^1$ and unsubstituted and substituted monovalent hydrocarbon radicals free of ethylenic unsaturation.

This ingredient must contain on each terminal unit at least one silicon-bonded alkenyl radical or in the alternative, at least one silicon bonded hydrogen radical. Other alkenyl radicals or silicon bonded hydrogen radicals can be present as pendent groups on the non-terminal units. It is preferred that ingredient A have alkenyl radicals rather than the silicon hydrogen bonds. Suitable alkenyl radicals contain from 1 to about 10 carbon atoms and are exemplified by but not limited to vinyl, allyl and 5-hexenyl. The silicon-bonded organic groups other than alkenyl radicals present in ingredient A are typically monovalent hydrocarbon and halogenated hydrocarbon radicals exemplified by but not limited to alkyl radicals such as methyl, ethyl and propyl; aryl radicals such as phenyl; and halogenated alkyl radicals such as 3,3,3-trifluoropropyl.

The molecular structure of ingredient A is typically linear, however there can be some branching due to the presence of trivalent siloxane units within the molecule. To achieve a useful level of tensile properties in the gels prepared by curing the present compositions, the molecular weight of this ingredient should be sufficient to achieve a viscosity at 25° C. greater than about 0.05 Pa.s.

Preferred embodiments of ingredient A are polydiorganosiloxanes represented by the general formula I

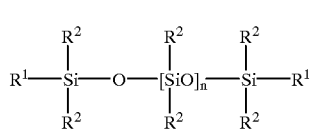

(I)

where each $R^1$ is a vinyl or other monovalent ethylenically unsaturated hydrocarbon radical, and $R^2$ does not contain ethylenic unsaturation and are individually selected from monovalent hydrocarbon radicals and monovalent halohydrocarbon radicals, and n represents a degree of polymerization equivalent to a viscosity of from 0.05 to 50 Pa.s. Preferably, n represents a degree of polymerization equivalent to a viscosity of from 0.1 Pa.s to 10 Pa.s, and most preferably, a viscosity of from 0.1 Pa.s to 5 Pa.s.

In the preferred embodiment, the substituents represented by $R^2$ in formula I can be identical or different, contain from 1 to about 20 carbon atoms and are free of ethylenic unsaturation. A range of from 1 to 10 carbon atoms is preferred based on the availability of the corresponding monomers. Most preferably at least one of the hydrocarbon radicals on each silicon atom is methyl, and any remainder are phenyl and/or 3,3,3-trifluoropropyl, this preference being based on the availability of the reactants typically used to prepare the polydiorganosiloxane and the properties of cured gels prepared from these polydiorganosiloxanes. For the same reasons, $R^1$ preferably contains from 2 to 10 carbon atoms and is most preferably vinyl or 5-hexenyl. It would be understood by those skilled in the art that while the preferred polymer does not have any pendant alkenyl groups, some small amounts may be present as a result of selected manufacturing processes, but excess amounts of pendant vinyl on the polymer will prevent the formation of a gel.

Representative embodiments of ingredient A containing ethylenically unsaturated hydrocarbon radicals only at the terminal positions include but are not limited to dimethylvinylsiloxy-terminated polydimethylsiloxanes, dimethylvinylsiloxy-terminated polymethyl-3,3,3-trifluoropropylsiloxanes, dimethylvinylsiloxy-terminated-dimethylsiloxane/3,3,3-trifluoropropylmethylsiloxane copolymers and dimethylvinylsiloxy-terminated-dimethylsiloxane/methylphenylsiloxane copolymers.

Methods for preparing ingredient A of the present compositions by hydrolysis and condensation of the corresponding halosilanes or by equilibration of the cyclic polydiorganosiloxanes are sufficiently disclosed in the patent and other literature that a detailed description in this specification is not necessary.

The Crosslinking Agent (Ingredient B)

The present compositions contain a crosslinking agent with at least two silicon-bonded hydrogen atoms or alkenyl radicals per molecule. In the presence of the hydrosilation catalyst, referred to as ingredient C, the silicon-bonded hydrogen atoms in ingredient B undergo an addition reaction, referred to as hydrosilation, with the silicon-bonded alkenyl groups in ingredient A, resulting in crosslinking and curing of the composition. If ingredient A contains silicon bonded hydrogen atoms then the crosslinking agent should contain alkenyl radicals, so it reacts with a portion of the silicon-bonded hydrogen atoms present on the polyorganosiloxane ingredient A.

The silicon-bonded organic groups present in ingredient B are selected from the same group of monovalent hydrocarbon and halogenated hydrocarbon radicals as the organic groups of ingredient A. Preferred cross-linking agents will have at least three silicon bonded hydrogen atoms. The molecular structure of ingredient B can be straight chain, branch-containing straight chain, cyclic, or network. The siloxane units of the crosslinking agent can exhibit the formulae $R^3_a SiO_{4-a/2}$, where each $R^3$ is individually selected from monovalent unsubstituted or substituted hydrocarbon radicals and a is 0, 1, 2 or 3. It should be understood that combinations of siloxane units containing different values of a can be present, and that one of the $R^3$ substituents represents hydrogen or alkenyl in at least two units of each molecule of crosslinking agent. Units wherein a is 0 can constitute up to about 50 mole percent of the units present in the curing agent.

While the molecular weight of ingredient B is not specifically restricted, viscosities in the range of 0.5 to 2 Pa.s at 25 degrees Centigrade are preferred. Using a different batch of the same type of curable polydiorganosiloxane (ingredient A) with a slightly different concentration of vinyl radicals can substantially change the physical properties of the cured articles when operating close to the limits of the range for the molar ratio of silicon-bonded hydrogen atoms to vinyl radicals.

The concentrations of ingredients A and B required to optimize the desired properties can be determined by routine experimentation with a knowledge of the present invention.

The curable composition contains more than 0.3 or less than 1.3 moles of silicon bonded hydrogen atoms per mole of alkenyl radicals. A preferred ratio is 0.4 to 1.1 a most preferred ratio is 0.4 to 0.9.

The concentration of ingredient B is sufficient to provide the degree of crosslinking required to cure the organosiloxane composition. When ingredient B is a polyorganohydrogensiloxane, the molar ratio of the silicon-bonded hydrogen atoms to the alkenyl radicals present in ingredient A is from 0.3 to 1.3.

A preferred cross-linking agent is a trimethylsiloxy-terminated polydiorganosiloxane having an average of five methylhydrogensiloxane units and three dimethylsiloxane units per molecule with a silicon-bonded hydrogen atom content of about 0.7 to 0.8 weight percent.

The Platinum-Containing Hydrosilation Reaction Catalyst (Ingredient C)

Curing of the present compositions is catalyzed by a hydrosilation catalyst that is a metal from the platinum group of the periodic table or a compound of such a metal. These metals include platinum, palladium and rhodium. Platinum and platinum compounds are preferred based on the high activity level of these catalysts in hydrosilation reactions.

Examples of preferred curing catalysts include but are not limited to platinum black, platinum metal on various solid supports, chloroplatinic acid, alcohol solutions of chloroplatinic acid, and complexes of chloroplatinic acid with liquid ethylenically unsaturated compounds such as olefins and organosiloxanes containing ethylenically unsaturated hydrocarbon radicals bonded to silicon. Complexes of chloroplatinic acid with the aforementioned organosiloxanes containing ethylenically unsaturated hydrocarbon radicals are described in U.S. Pat. No. 3,419,593, which issued to David N. Willing on Dec. 31, 1968. The relevant portions of this patent are incorporated herein by reference as a teaching of preferred catalysts.

The concentration of ingredient C in the present compositions is equivalent to a platinum concentration of from 0.1 to 500 parts by weight of platinum metal, preferably from 1 to 50 parts by weight of platinum metal, per parts million (ppm), based on the combined weight of ingredients A and B.

Curing does not proceed satisfactorily at below 0.1 ppm of platinum, while using more than 500 ppm results in no appreciable increase in cure rate, and is therefore uneconomical.

Non-Functional Silicone Fluid (Ingredient D)

The composition of the present invention includes non-functional silicone fluids comprising oligomers and/or polymers having a general formula selected from the group consisting of $[(R)_2SiO]_n$ and $(R)_3SiO-[(R)_2SiO]q-Si(R)_3$, where R is independently selected from the group consisting of alkyl groups, aryl groups and $-[(R')_2SiO]_p-R'$ wherein R' is alkyl or aryl, n is independently an integer of about 2 to about 10, p is an integer of 0 or greater, and q is independently an integer of 0 or greater (preferably about 0 to about 1000). Preferably, R and R' are each independently selected from the group consisting of about $C_1$ to about $C_{10}$ saturated linear hydrocarbon radicals, about $C_1$ to about $C_{10}$ saturated branched hydrocarbon radicals, about $C_6$ to about $C_{12}$ alkyl substituted aromatic hydrocarbon radicals, about $C_3$ to about $C_{10}$ saturated cycloaliphatic hydrocarbon radicals, and combinations thereof. Most preferably, R and R' are each independently selected from the group consisting of methyl, ethyl, n-propyl, and isopropyl. These materials have been described in detail in, e.g., "Chemistry and Technology of Silicones" by W. Knoll, Academic Press, 1968. Siloxanes comprise several structural classes all of which are useful herein: linear, branched, and cyclic. Mixtures of the aforementioned are also useful herein. Many of the linear, branched, and cyclic polysiloxanes have melting points below about 25° C. Such materials are also commonly referred to as silicone liquids, silicone fluids, or silicone oils.

The non-functional silicone fluid will comprise at least 25% by weight of the composition, and preferably at least 50% by weight. A preferred range is 50 to 70% by weight.

The term "non-functional silicone fluids" as used herein includes organosiloxanes, organosiloxane oligomers, and polyorganosiloxanes. The term "non-functional" means that the fluid does not contain groups that would react with either ingredients A or B under normal conditions. The general term "polyorganosiloxanes," is often shortened to "polysiloxanes," and both terms are adopted and used interchangeably herein. Useful non-functional silicone fluids according to the invention are not limited to those with silicon atoms bearing methyl groups exclusively. Any silicone fluid having saturated hydrocarbon groups as substituents on the silicon atoms would be useful, providing their viscosities fall within the range described infra., and providing the fluid is compatible with ingredients A and B. Such saturated hydrocarbon groups may be linear, branched, or cyclic. Silicone fluids bearing functionalized organic groups which would interfere with the cure of the composition according to the invention, such as hydrogen, halogen, or alkoxy, would not be useful, and are therefore outside the scope of the present invention.

Preferred non-functional siloxane fluids according to the invention include but are not limited to those of the formula (I)

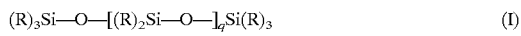
(I)

wherein q represents an integer of 0 or greater, and R is independently selected from the group consisting of alkyl groups and aryl groups. Preferably, R is independently selected from the group consisting of about $C_1$ to about $C_{10}$ saturated linear hydrocarbon radicals, about $C_1$ to about $C_{10}$ saturated branched hydrocarbon radicals, about $C_6$ to about $C_2$ alkyl substituted aromatic hydrocarbon radicals, about $C_3$ to about $C_{10}$ saturated cycloaliphatic hydrocarbon radicals, and combinations thereof. Most preferably, R is independently selected from the group consisting of methyl and phenyl.

Examples of specific linear siloxane fluids useful according to the method of the invention are the siloxane oligomers of the formula (Ia), commercially available from Dow Corning as "Dow Corning® 200 Fluids":

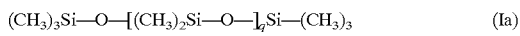
(Ia)

wherein q represents an integer of 0 or greater. The fluids are manufactured to yield essentially linear oligomers and/or polymers with average viscosities typically ranging from 0.00065 Pa.s to about 50 Pa.s which are primarily linear but which can include cyclic and/or branched structures. A more preferred range is from 0.025 Pa.s to 10 Pa.s and a most preferred range is from 0.50 Pa.s to 5 Pa.s. A preferred linear siloxane fluid is the dimethylsiloxane of Formula Ia wherein q is an integer of about 0 to about 1500. The fluids exhibit a range of q-values and are preferably characterized by their viscosity rather than their molecular size. A particularly preferred fluid has a viscosity of 0.350 Pa.s available from Dow Corning Corporation as Dow Corning® 200 Fluid.

Examples of useful cyclic siloxanes according to the invention include but are not limited to those of the general formula

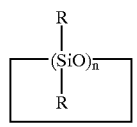

wherein n represents an integer of 3 to about 9, preferably about 4 to about 7; and R is independently selected from the group consisting of alkyl groups and aryl groups. Preferably, R is independently selected from the group consisting of about $C_1$ to about $C_{10}$ saturated linear hydrocarbon, radicals, about $C_1$ to about $C_{10}$ saturated branched hydrocarbon radicals, about $C_6$ to about $C_{12}$ alkyl substituted aromatic hydrocarbon radicals, about $C_3$ to about $C_{10}$ saturated cycloaliphatic hydrocarbon radicals, and combinations thereof. Most preferably, R is independently selected from the group consisting of methyl and phenyl.

Examples of specific cyclic siloxanes useful for the subject polymerization include the cyclic polydimethylcyclosiloxanes of formula (IIa)

(IIa)

wherein n represents an integer of about 3 to about 9, preferably about 4 to about 7. The most preferred cyclic siloxanes, those in which n is 4 to 5, are also known as octamethylcyclotetrasiloxane (commonly referred to as "$D_4$"), and decamethylcyclopentasiloxane ("$D_5$"), respectively. These materials are also made available by Dow Corning Corporation as Dow Corning® 244, 245, 344, and 345 Fluids, depending on their relative proportions of $D_4$ and $D_5$. Mixtures of the straight-chain and cyclic dimethyl siloxanes are also useful according to the present invention.

Useful branched siloxane fluids according to the method of the invention include but are not limited to those of the general structures (III) and (IV),

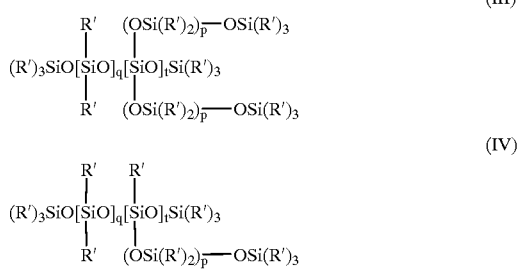

wherein each R' is independently selected from the group consisting of alkyl and aryl groups; t represents an integer of from about 1 to about 5, and q and p independently represent an integer of 0 or greater, providing the branched polyorganosiloxane exhibits a viscosity within the ranges as cited above and has a melting point below about 25° C. and may be used in the liquid state as a reaction solvent. Preferably, R' is independently selected from the group consisting of about $C_1$ to about $C_{10}$ saturated linear hydrocarbon, radicals, about $C_1$ to about $C_{10}$ saturated branched hydrocarbon radicals, about $C_6$ to about $C_{12}$ alkyl substituted aromatic hydrocarbon radicals, about $C_3$ to about $C_{10}$ saturated cycloaliphatic hydrocarbon radicals, and combinations thereof. Most preferably, R' is independently selected from the group consisting of methyl and phenyl.

Examples of useful branched polymers are those of the general formulas (IIIa) and (IVa)

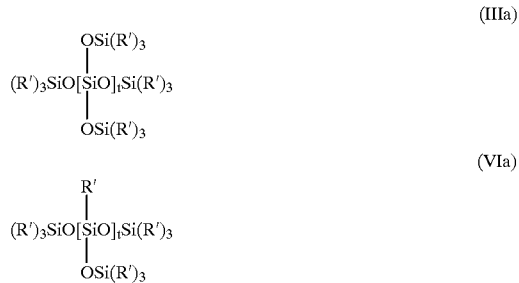

wherein R' and t are as previously defined, for formulas III and IV.

Optional Ingredients

While the preferred embodiment of the invention is limited to the mixture of the ingredients A, B, C, and D described above, it is contemplated by the inventors that any siloxane based gel could benefit by the addition of the non-functional silicone fluid. For example, the non-functional silicone fluid can be added to the gels having chain extenders described in U.S. Pat. No. 5,371,163, which is incorporated herein by reference. Other systems include gels described in U.S. Pat. Nos. 4,100,627; 4,340,709; 4,824,390; 5,145,933; and 5,275,841 and JP 63035654, all of which are incorporated by reference herein.

Mixtures of the aforementioned ingredients A, B, C and D may begin to cure at ambient temperature. To obtain a longer working time or "pot life", the activity of the catalyst under ambient conditions can be retarded or suppressed by addition of a suitable inhibitor.

Known platinum catalyst inhibitors include the acetylenic compounds disclosed in U.S. Pat. No. 3,445,420. Acetylenic alcohols such as 2-methyl-3-butyn-2-ol constitute a preferred class of inhibitors that will suppress the activity of a platinum-containing catalyst at 25° C. Compositions containing these catalysts typically require heating at temperatures of 70° C. or above to cure at a practical rate.

If it desired to increase the pot life of a curable composition under ambient conditions, this can be accomplished using an alkenyl substituted siloxane of the type described in U.S. Pat. No. 3,989,667. Cyclic methylvinylsiloxanes are preferred.

Inhibitor concentrations as low as one mole of inhibitor per mole of platinum will in some instances impart satisfactory storage stability and cure rate. In other instances inhibitor concentrations of up to 500 or more moles of inhibitor per mole of platinum are required. The optimum concentration for a given inhibitor in a given composition can readily be determined by routine experimentation and does not constitute part of this invention.

Some compositions may begin to cure under ambient conditions even when an inhibitor is present. One way to ensure storage stability is to package the ingredients of the curable composition in two or more containers, with the hydrosilation catalyst and the organohydrogensiloxane in separate containers. The contents of the containers are combined when it is desired to cure the composition.

One-part organosiloxane compositions having excellent long-term storage stability at temperature of up to 50° C. or higher can be prepared by first microencapsulating the platinum-containing hydrosilation catalyst in a thermoplastic or thermosetting polymer. Curable organosiloxane compositions containing microencapsulated hydrosilation catalysts are described in U.S. Pat. No. 4,766,176, and U.S. Pat. No. 5,017,654. The teaching of these patents relating to storage stable one-part organosiloxane compositions is incorporated herein by reference. Suitable encapsulants include but are not limited to organosilicon resins and organic resins derived from ethylenically unsaturated hydrocarbons and/or esters of ethylenically unsaturated carboxylic acids such as acrylic and methacrylic acids.

To achieve high levels of tear strength and other physical properties that characterize some types of cured elastomers that can be prepared using the compositions of this invention, it may be desirable to include a reinforcing filler such as finely divided silica. Silica and other reinforcing fillers are often treated with one of more of the known filler treating agents to prevent a phenomenon referred to as "creping" or "crepe hardening" during processing of the curable composition.

Finely divided forms of silica are preferred reinforcing fillers. Silicas are particularly preferred because of their relatively high surface area, which is typically at least 50 square meters per gram. Fillers having surface areas of at least 150 square meters per gram are preferred for use in the present method. Silicas can be of the precipitated or a fumed type. Both types of silica are commercially available The amount of finely divided silica or other reinforcing filler used in the present compositions is at least in part determined by the physical properties desired in the cured elastomer. Liquid polyorganosiloxane compositions typically contain from about 10 to about 30 percent by weight of silica, based on the weight of polydiorganosiloxane. The amount of silica or other filler should not exceed the amount that increases the viscosity of the curable composition above about 1000 Pa.s. prior to cure.

The filler treating agent can be any of the low molecular weight organosilicon compounds disclosed in the art as being suitable for preventing creping of organosiloxane compositions during processing. The treating agents are typically liquid hydroxyl terminated polydiorganosiloxanes containing an average of from 2 to about 20 repeating units per molecule, and organosilicon compounds such as hexaorganodisiloxanes and hexaorganodisilazanes that hydrolyze under the conditions used to treat the filler to form compounds with silicon-bonded hydroxyl groups. Preferably at least a portion of the silicon bonded hydrocarbon radicals present on the treating agent are identical to a majority of the hydrocarbon radicals present in ingredients A, B and C. A small amount of water can be added together with the silica treating agent(s) as a processing aid.

It is believed that the treating agents function by reacting with silicon-bonded hydroxyl groups present on the surface of the silica or other filler particles to reduce interaction between these particles, and between polymer and filler.

When a silica filler is used, it is preferably treated in the presence of at least a portion of the other ingredients of the present compositions by blending these ingredients together until the filler is completely treated and uniformly dispersed to form a homogeneous material.

The ingredients that are present during treatment of the filler typically include the silica treating agents and at least a portion of the polydiorganosiloxane(s) referred to herein as ingredient A.

The present organosiloxane compositions can contain one or more additives that are conventionally present in curable compositions of this type to impart or enhance certain physical properties of the cured composition in addition to adhesion or to facilitate processing of the curable composition.

Typical additives include but are not limited to non-reinforcing fillers such as quartz, alumina, mica and calcium carbonate; pigments such as carbon black and titanium dioxide; dyes, flame retardants, and heat and/or ultraviolet light stabilizers.

Preparation of Curable Compositions

The compositions of this invention can be prepared by combining all of ingredients at ambient temperature. Any of the mixing techniques and devices described in the prior art can be used for this purpose. The particular device used will be determined by the viscosity of the ingredients and the final curable composition. Suitable mixers include but are not limited to paddle type mixers and kneader type mixers. Cooling of the ingredients during mixing may be desirable to avoid premature curing of the composition.

The gels may be made in a multi-part system having two or more parts. In a typical preparation, the non-functional silicone fluid, the cataylst, and first polysiloxane would be mixed together as Part A, and the non-functional silicone fluid, the cross-linking agent, and first polysiloxane would be mixed together as Part B. When the Parts A and B are mixed together, a gel forms. Such a system could contain any number of different parts, with different amounts of different ingredients. It is necessary, however, that the cross-linker and catalyst are not in the same part, if the crosslinker contains silicon bonded hydrogen atoms, or if the polysiloxane of ingredient A contains silicon bonded hydrogen atoms, then ingredient A and the catalyst must be in different parts.

EXAMPLES

The following examples demonstrate that a non-functional silicone fluid can be added to a gel without bleed out, and that the weight loss and high temperature aging of the gel is improved relative to gels without the non-functional silicone fluid, and should not be interpreted as limiting the scope of the invention defined in the accompanying claims. Unless otherwise specified all parts and percentages in the examples are by weight and viscosities were measured at 25° C.

Example 1

This example shows how a non-functional silicone fluid can be added to a silicone elastomeric gel composition without the tendency of the fluid to "bleed out" of the gel. To demonstrate the lack of bleed out, varying amounts of non-functional silicone fluids of different viscosities were added to a particular gel composition and bleed out was monitored The gels were prepared from a two part composition. In each of the formulations below, Part A of the gel was made by mixing either 50, 60, 70 or 80 weight percent of non-functional silicone fluid, 0.04 weight percent platinum catalyst and 49.96, 39.96, 29.96 or 19.96 weight percent, respectively, of vinyl terminated polydimethylsiloxane, having a viscosity of 0.45 Pa.s. The non-functional silicone fluid was a methyl end blocked polydimethylsiloxane having viscosities of 0.05 Pa.s, 0.10 Pa.s, 0.35 Pa.s and 1.0 Pa.s, respectively. The hydrosililation catalyst was a platinum catalyst, which was a neutralized complex of platinous chloride and divinlytetramethyldisiloxane.

Part B was made by mixing either 50, 60, 70 or 80 weight percent of non-functional silicone fluid, and the respective amounts of crosslinker and the above described vinyl terminated polydimethylsiloxane polymer, as shown in Table 1. The crosslinker was a trimethylsiloxy-terminated polydiorganosiloxane having an average of five methylhydrogensiloxane units and three dimethylsiloxane units per molecule with a silicon-bonded hydrogen atom content of about 0.7 to 0.8 weight percent. ("Crosslinker 1")

TABLE 1

| | Weight % Crosslinker and Vinyl Terminated Polydiorganosiloxane Added to Part B | | | |
|---|---|---|---|---|
| % Non-Functional | Non-Functional Silicone Fluid Viscosity | | | |
| Silicone Fluid in Part B | .05 Pa.s Crosslinker/Si-Vi | 0.10 Pa.s Crosslinker/Si-Vi | 0.35 Pa.s Crosslinker/Si-Vi | 1.0 Pa.s Crosslinker/Si-Vi |
| 50% | 1.08%/48.92% | 1.06%/48.94% | 1.03%/48.97% | 1.05%/48.95% |
| 60% | 0.93%/39.07% | 0.93%/39.07% | 0.99%/39.01% | 0.97%/39.03% |

TABLE 1-continued

Weight % Crosslinker and Vinyl Terminated Polydiorganosiloxane Added to Part B

| % Non-Functional Silicone Fluid in Part B | Non-Functional Silicone Fluid Viscosity | | | |
|---|---|---|---|---|
| | .05 Pa.s Crosslinker/Si-Vi | 0.10 Pa.s Crosslinker/Si-Vi | 0.35 Pa.s Crosslinker/Si-Vi | 1.0 Pa.s Crosslinker/Si-Vi |
| 70% | 0.77%/29.23% | 0.77%/29.23% | 0.82%/29.18% | 0.85%/29.15% |
| 80% | 0.64%/9.36% | 0.64%/19.36% | 0.72%/19.28% | 0.69%/19.31% |

After the Parts A and B were prepared as described above, 50% by weight of Part A was mixed with 50% by weight of Part B and stirred for one minute. 80 grams of each of the mixtures were then poured into six 4 ounce wide mouth jars, then heated to 50° C. for one hour. Afterwards, the mixtures were allowed to rest for 24 hours at room temperature.

The mixtures in each of the six jars were exposed to different temperatures. Two of the jars were heated to 125° C., two to 135° C., and two to 150° C. One jar in each set was heated with a lid screwed on, the other with the lid off. Visual observations of the gel in the jars were made and recorded in Table 2.

TABLE 2

Bleed Out of Cured Elastomer

| % Non-Functional Silicone Fluid in Parts A and B | Non-Functional Silicone Fluid Viscosity | | | |
|---|---|---|---|---|
| | .05 Pa.s | 0.10 Pa.s | 0.35 Pa.s | 1.0 Pa.s |
| 50% | OK at 500 hr. | OK at 500 hr. | OK 500 hr. | wet out at 100 hr. |
| 60% | OK at 500 hr. | OK at 500 hr. | slight oil at 100 hr. | Slight oil at 100 hr. |
| 70% | OK at 500 hr. | oily at 300 hr. | oily at 200 hr. | Severe bleed at <100 hr. |
| 80% | very slight bleed at higher temps at 200 hr. | slight bleed at high temps at <300 hr. | <200 hr. Bleed | severe bleed at <100 hr. |

"OK" = no bleed out

The results show that the elastomeric compositions of the present invention can include large amounts of non-functional silicone fluid without the fluid bleeding out of the gel.

Example 2

The compositions of the present invention result in lower weight loss over time. The cured elastomeric compositions prepared in accordance with Example 1 were heated to a temperature of 150° C. for 500 hours and the weight loss measured.

TABLE 3

Percent Weight Loss as a Function of Amount and Viscosity of Non-Functional Silicone Fluid

| % Non-Functional Silicone Fluid in Parts A and B | Non-Functional Silicone Fluid Viscosity | | | |
|---|---|---|---|---|
| | .05 Pa.s | 0.10 Pa.s | 0.35 Pa.s | 1.0 Pa.s |
| 50% | 0.59 | 0.54 | 0.50 | 0.50 |
| 60% | 0.49 | 0.41 | 0.41 | 0.50* |
| 70% | 0.39 | 0.31 | 0.41* | 0.49* |
| 80% | 0.29 | 0.22 | 0.93* | 1.69* |

*The bleed out observed on these samples impacted weight loss values.

In contrast, gels prepared without the non-functional silicone fluid showed much higher weight loss. A two part gel was prepared, where Part A was 99.3% by weight of vinyl terminated polydimethylsiloxane, having a viscosity of 0.45 Pa.s. and 0.7% by weight of a platinum catalyst, which was chloroplatinic acid complex of divinyltetramethyldisiloxane diluted with dimethylvinlysiloxy endblocked polydimethlysiloxane to provide 0.65 weight percent platinum. Part B was 98.2% by weight of vinyl terminated polydimethylsiloxane, having a viscosity of 0.45 Pa.s. and 0.09% by weight of a methyl vinyl cyclic, which was added as an inhibitor, and 1.71% by weight Crosslinker 1. A gel was prepared as described in Example 1, and a sample was heated at 150° C. for 2 hours. The weight lost for this gel was 2% of the composition, nearly four to eight times higher than the samples with the non-functional silicone fluid described in Table 3 above.

Example 3

The hardness of a gel containing the non-functional silicone fluid remains stable over longer periods of time, whereas the gel without the fluid hardens over time.

The gels were prepared from a two part composition. The first gel did not contain any of the non-functional silicone fluid. Part A of the gel was made by mixing the 1.2.g of a platinum catalyst, which was chloroplatinic acid complex of divinyltetramethyldisiloxane diluted with dimethylvinylsiloxy endblocked polydimethlysiloxane to provide 0.65 weight percent platinum, and 300 g. of vinyl terminated polydimethylsiloxane, having a viscosity of 0.45 Pa.s. Part B of the first gel contained 294.9 g of vinyl terminated polydimethylsiloxane, having a viscosity of 0.45 Pa.s. and 5.1 g. of Crosslinker 1 which was the cross-linking agent.

After the Parts A and B were prepared as described above, 50% by weight of Part A was mixed with 50% by weight of Part B and stirred for one minute. 80 grams the mixtures were then poured into six a 4 ounce wide mouth jar, then heated to 150° C. for one hour.

The second gel contained the non-functional silicone fluid. Part A of the gel was made by mixing the 1.2. g of a platinum catalyst, which was chloroplatinic acid complex of divinyltetramethyldisiloxane diluted with dimethylvinylsiloxy endblocked polydimethlysiloxane to provide 0.65 weight percent platinum, and 300 g. of methyl endblocked polydimethylsiloxane, having a viscosity of 1.0 Pa.s. Part B of the first gel contained 296.1 g of vinyl terminated polydimethylsiloxane, having a viscosity of 0.45 Pa.s. and 3.9 g. of Dow Corning 6–3570 which was the cross-linking agent.

After the Parts A and B were prepared as described above, 50% by weight of Part A was mixed with 50% by weight of Part B and stirred for one minute. 80 grams the mixtures were then poured into six a 4 ounce wide mouth jar, then heated to 150° C. for one hour. Afterwards, the first and second gels were placed in an oven and heated to 177° C. The hardness of the gel was measured by measuring the penetration. The penetration was measured on a Universal Penetrometer available from Precision Scientific, Chicago, Ill. The measurements were made by placing the gel in the Penetrometer and lowering the penetration rod so that it just touched the surface of the gel. The release trigger was held for 5 seconds and the distance the penetration rod traveled was measured in tenths of a millimeter. The results are shown in Table 4.

TABLE 4

Penetration of Heat Aged Gel over Time

| Hours at 177° C. | Penetration (mm × $10^{-1}$) | |
|---|---|---|
| | 0% Non-functional Si Fluid | 50% Non-functional Si Fluid |
| 0 | 48 | 33 |
| 170 | 44 | 37 |
| 525 | 42 | 36 |
| 864 | 43 | 34 |
| 2568 | 34 | 37 |

As the data in Table 4 illustrates, the gel without the non-functional silicone fluid shows a penetration that drops to 34 after over 3 months of aging, while the penetration of the fluid containing gel of the present invention remains constant over the same period. This shows that the gel with the non-functional silicone fluid did not hardened like the gel without the fluid. The gels of the present invention have improved heat aging properties over gels without fluid.

That which is claimed is:

1. A curable organosiloxane composition consisting essentially of:
  A. a first polyorganosiloxane having terminal siloxane units of the formula $R^1R^2_2SiO_{1/2}$ and non-terminal organosiloxane units of the formula $R^2_2SiO$ where $R^1$ represents an alkenyl radical, and each $R^2$ is independently selected from $R^1$ or unsubstituted or substituted monovalent hydrocarbon radicals free of ethylenic unsaturation;
  B. a polyorganosiloxane cross-linking agent containing an average of at least two silicon-bonded hydrogen atoms per molecule, where the remaining silicon-bonded organic groups are monovalent hydrocarbon radicals selected from the same group as $R^2$;
  C. an amount of a hydrosilation catalyst sufficient to promote curing of said composition; and
  D. a non-functional silicone fluid which is at least 25% by weight of said composition
wherein said composition forms a gel when cured.

2. A composition according to claim 1 wherein the $R^1$ on the terminal siloxane units for polyorganosiloxane A is vinyl, and the $R^2$ on the non-terminal siloxane units are selected from unsubstituted or substituted monovalent hydrocarbon radicals free of ethylenic unsaturation, and the cross-linking agent in cross-linking agent B has silicon bonded hydrogen atoms.

3. A composition according to claim 2 wherein the cross-linking agent has at least three silicon bonded hydrogen atoms.

4. A composition according to claim 2 wherein polyorganosiloxane A is a vinyl terminated polydimethyl siloxane.

5. A composition according to claim 1 wherein the viscosity of polyorganosiloxane A is between 0.1 Pa.s and 50 Pa.s.

6. A composition according to claim 1 wherein the hydrosilation catalyst is a platinum catalyst.

7. A composition according to claim 1 wherein the non-functional silicone fluid is a methyl endblocked polydimethylsiloxane.

8. A composition according to claim 2 wherein the non-functional silicone fluid is a methyl endblocked polydimethylsiloxane.

9. A composition according to claim 1 wherein the non-functional silicone fluid has a viscosity of from about 0.00065 Pa.s to about 50 Pa.s.

10. A composition according to claim 2 wherein the non-functional silicone fluid has a viscosity of from about 0.00065 Pa.s to about 50 Pa.s.

11. A composition according to claim 1 wherein the non-functional silicone fluid is present in an amount of 35 to 85 percent by weight of the composition.

12. A composition according to claim 2 wherein the non-functional silicone fluid is present in an amount of 35 to 85 percent by weight of the composition.

13. A composition according to claim 1, wherein polyorganosiloxane A is a vinyl terminated polydimethyl siloxane having a viscosity of about 0.45 Pa.s., cross-linking agent B is a methyl end blocked siloxane polymer having a degree of polymerization of eleven and six silicon bonded hydrogen units, hydrosilation catalyst C is a platinum catalyst, and non-functional silicone fluid D is a methyl endblocked polydimethylsiloxane having a viscosity of from about 0.00065 Pa.s to about 50 Pa.s.

14. The composition according to claim 1, wherein the molar ratio of silicon bonded hydrogen groups to alkenyl groups is about 0.3 to about 1.3.

15. A cured organosiloxane gel comprising a reaction product of composition of claim 1.

16. A cured organosiloxane gel comprising a reaction product of composition of claim 2.

17. A cured organosiloxane gel comprising a reaction product of composition of claim 8.

18. A cured organosiloxane gel comprising a reaction product of composition of claim 12.

19. A multi-part composition comprising:
   A. a first polyorganosiloxane having terminal siloxane units of the formula $R^1R^2{}_2SiO_{1/2}$ and non-terminal organosiloxane units of the formula $R^2{}_2SiO$ where $R^1$ represents an alkenyl radical, and each $R^2$ is independently selected from $R^1$ or unsubstituted or substituted monovalent hydrocarbon radicals free of ethylenic unsaturation;
   B. a polyorganosiloxane cross-linking agent containing an average of at least two silicon-bonded hydrogen atoms per molecule, where the remaining silicon-bonded organic groups are monovalent hydrocarbon radicals selected from the same group as $R^2$;
   C. an amount of a hydrosilation catalyst sufficient to promote curing of said composition; and
   D. a non-functional silicone fluid which is at least 25% by weight of the composition;

with the proviso that the cross-linking agent and hydrosilation catalyst are not both in the same part and wherein mixing components (A) through (D) produces a composition that forms a gel when cured.

20. A multi-part composition according to claim 19, wherein polyorganosiloxane A is a vinyl terminated polydimethyl siloxane having a viscosity of about 0.45 Pa.s., cross-linking agent B is a methyl end blocked siloxane polymer having a degree of polymerization of eleven and six silicon bonded hydrogen units, hydrosilation catalyst C is a platinum catalyst, and non-functional silicone fluid D is a methyl endblocked polydimethylsiloxane having a viscosity of from about 0.00065 Pa.s to about 50 Pa.s.

21. The composition of claim 1 cured on a printed circuit board.

22. The composition of claim 2 cured on a printed circuit board.

* * * * *